(12) United States Patent
Jagt et al.

(10) Patent No.: US 10,606,158 B2
(45) Date of Patent: Mar. 31, 2020

(54) LIGHT EMITTING DEVICE

(71) Applicant: SIGNIFY HOLDING B.V., Eindhoven (NL)

(72) Inventors: Hendrik Johannes Boudewijn Jagt, Eindhoven (NL); Dominique Maria Bruls, Eindhoven (NL); Daniël Anton Benoy, Eindhoven (NL); Dirk Kornelis Gerhardus De Boer, Eindhoven (NL); Hugo Johan Cornelissen, Eindhoven (NL); Joris Jan Vrehen, Eindhoven (NL); Jacobus Gerardus Boerekamp, Eindhoven (NL); Christoph Gerard August Hoelen, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/077,962

(22) PCT Filed: Mar. 6, 2017

(86) PCT No.: PCT/EP2017/055136
§ 371 (c)(1),
(2) Date: Aug. 14, 2018

(87) PCT Pub. No.: WO2017/157705
PCT Pub. Date: Sep. 21, 2017

(65) Prior Publication Data
US 2019/0179218 A1    Jun. 13, 2019

(30) Foreign Application Priority Data
Mar. 15, 2016   (EP) ...................................... 16160318

(51) Int. Cl.
G03B 21/20    (2006.01)
F21V 29/70    (2015.01)
(Continued)

(52) U.S. Cl.
CPC .............. *G03B 21/204* (2013.01); *F21K 9/64* (2016.08); *F21S 41/16* (2018.01); *F21S 41/176* (2018.01);
(Continued)

(58) Field of Classification Search
CPC .. G03B 21/204; G03B 21/16; G03B 21/2066; F21V 29/502; F21V 29/70; F21V 9/30;
(Continued)

(56) References Cited

U.S. PATENT DOCUMENTS 8,662,672 B2    3/2014   Hikmet et al.
10,145,533 B2 * 12/2018  Popovich ................. G02B 5/32
(Continued)

FOREIGN PATENT DOCUMENTS

DE    102014100723 A1 *  7/2015    .............. F21S 41/19
DE    102014100723 A1    7/2015
(Continued)

*Primary Examiner* — Mary Ellen Bowman
(74) *Attorney, Agent, or Firm* — Daniel J. Piotrowski

(57) ABSTRACT

A light emitting device (1) comprising a luminescent element (3) comprising a first face (31) and a second face (32), the first face comprising a light input surface and one of the first face and the second face comprising a light exit surface, the luminescent element (3) being adapted for receiving first light (4) with a first spectral distribution emitted by at least one laser light source (21, 22, 23) at the light input surface, converting at least a part of the first light with the first spectral distribution to second light (5) with a second spectral distribution, guiding the second light with the second spectral distribution to the light exit surface and coupling at least a part of the second light with the second spectral distribution out of the light exit surface, and a heat sink element (7) arranged to be in thermal contact with at least a part of the luminescent element (3) extending between the first face (31) and the second face (32), wherein the first face (31) comprises a cross-sectional area A and the (Continued)

luminescent element (3) further comprises a length L being defined as the shortest distance between the first face and the second face and a characteristic length B of the cross sectional area A, the characteristic length B being defined as the square root of the cross sectional area A, and wherein, and wherein the length L and the characteristic length B of the cross sectional area A are chosen such that they satisfy any one of the relations $L/B \geq 2*E_{lls}/44(W/mm^2)$ for $\lambda_{THC} < 6$ W/mK, $L/B \geq 1.3*E_{lls}/44(W/mm^2)$ for $6$ W/mK $\leq \lambda_{THC} \leq 8$ W/mK, and $L/B \geq 0.85*E_{lls}/44(W/mm_2)$ for $8$ W/mK $< \lambda_{THC}$, where $E_{lls}$ is the irradiance of the at least one laser light sources measured in W/mm² and $\lambda_{THC}$ is the thermal heat coefficient of the luminescent element at room temperature.

14 Claims, 10 Drawing Sheets

(51) Int. Cl.

| | | |
|---|---|---|
| *F21V 29/502* | (2015.01) | |
| *F21K 9/64* | (2016.01) | |
| *F21V 9/30* | (2018.01) | |
| *F21S 41/16* | (2018.01) | |
| *H01S 5/00* | (2006.01) | |
| *F21S 41/176* | (2018.01) | |
| *F21S 41/20* | (2018.01) | |
| *G03B 21/16* | (2006.01) | |
| *F21V 7/00* | (2006.01) | |
| *F21V 5/00* | (2018.01) | |
| *F21Y 101/00* | (2016.01) | |
| *F21V 7/22* | (2018.01) | |
| *H01S 5/40* | (2006.01) | |
| *H01S 5/323* | (2006.01) | |

(52) U.S. Cl.
CPC .............. *F21S 41/285* (2018.01); *F21V 9/30* (2018.02); *F21V 29/502* (2015.01); *F21V 29/70* (2015.01); *G03B 21/16* (2013.01); *G03B 21/2066* (2013.01); *H01S 5/005* (2013.01); *F21V 5/00* (2013.01); *F21V 7/0091* (2013.01); *F21V 7/22* (2013.01); *F21Y 2101/00* (2013.01); *H01S 5/32341* (2013.01); *H01S 5/4025* (2013.01)

(58) Field of Classification Search
CPC . F21K 9/64; F21S 41/176; F21S 41/16; F21S 41/285; H01S 5/005
See application file for complete search history.

(56) References Cited

U.S. PATENT DOCUMENTS

| | | | |
|---|---|---|---|
| 2006/0279950 A1* | 12/2006 | Hama | A61B 1/0653 |
| | | | 362/257 |
| 2011/0141763 A1 | 6/2011 | Kamee et al. | |
| 2012/0140504 A1 | 6/2012 | Fukai et al. | |
| 2013/0250544 A1 | 9/2013 | Zink et al. | |
| 2013/0314893 A1* | 11/2013 | Paquette | G02F 1/353 |
| | | | 362/84 |
| 2014/0003074 A1 | 1/2014 | Kishimoto | |
| 2014/0022512 A1* | 1/2014 | Li | F21V 9/00 |
| | | | 353/31 |
| 2015/0049457 A1* | 2/2015 | Kroell | G01N 21/8806 |
| | | | 362/84 |
| 2015/0172610 A1* | 6/2015 | Candry | G03B 21/142 |
| | | | 353/85 |
| 2015/0267897 A1 | 9/2015 | Brukilacchio et al. | |
| 2017/0315433 A1* | 11/2017 | Ronda | C04B 35/6455 |

FOREIGN PATENT DOCUMENTS

| | | |
|---|---|---|
| WO | WO2009017992 A1 | 2/2009 |
| WO | WO2009115976 A1 | 9/2009 |
| WO | WO2010049875 A1 | 5/2010 |
| WO | WO2012004713 A1 | 1/2012 |
| WO | WO2015067476 A1 | 5/2015 |

* cited by examiner

LIGHT EMITTING DEVICE

CROSS-REFERENCE TO PRIOR APPLICATIONS

This application is the U.S. National Phase application under 35 U.S.C. § 371 of International Application No. PCT/EP2017/055136, filed on Mar. 6, 2017, which claims the benefit of European Patent Application No. 16160318.8, filed on Mar. 15, 2016. These applications are hereby incorporated by reference herein.

FIELD OF THE INVENTION

The invention relates to a light emitting device comprising a luminescent element comprising a first face and a second face, the first face comprising a light input surface and one of the first face and the second face comprising a light exit surface, the luminescent element being adapted for receiving first light with a first spectral distribution emitted by at least one laser light source at the light input surface, converting at least a part of the first light with the first spectral distribution to second light with a second spectral distribution, guiding the second light with the second spectral distribution to the light exit surface and coupling at least a part of the second light with the second spectral distribution out of the light exit surface.

As used herein the term "luminescent element" is intended to encompass generally rod-shaped luminescent elements with opposite first and second faces and a circumferential surface extending between the first and second faces, and furthermore with a length L defined as the shortest distance between the opposite first and second faces, an arbitrarily shaped cross-sectional area A of the first face and a characteristic length B of the cross sectional area A, the characteristic length B being defined as the square root of the cross sectional area A. Possible shapes of the cross sectional area A include but are not limited to quadrilateral, triangular, hexagonal, round, circular and ellipsoidal cross-sectional shapes. For the specific case of a quadrilateral cross-sectional area A, the characteristic length B would be identical to the geometrical mean length of the cross-sectional area A.

BACKGROUND OF THE INVENTION

Conventional laser systems for digital projection typically consist of an array of blue lasers that are focused to a spot size of several $mm^2$, such as 2 $mm^2$, on a rotating phosphor wheel. The phosphor wheel is rotating at a typical speed of 60 Hz. A phosphor is partially coated on a rotating disk. The reflected light from the phosphor is used for the green channel of a projector. The rotating disc may comprise a transparent segment used to transmit blue laser light for the blue channel of the projector. The red channel of the projector may be made with a red LED module. Such a projector is known as a hybrid LED-laser projector, time-sequentially driven in connection with a DLP display.

With another example of a phosphor wheel the phosphor is used in a reflective mode and coated onto a metal substrate for improved cooling.

There also exist full laser phosphor projectors that do not contain LED sources. In this case the phosphor wheel is used in transmissive mode to generate white light that is subsequently divided into R, G and B with dichroic mirrors for use in LCD projection (with 3 LCD panels).

Solutions employing a phosphor wheel use the motion of the wheel to distribute the incident laser light and cool the phosphor. This has several drawbacks, including:
- The system includes moving parts that may wear out and are sensitive to failure. When the rotation of the wheel fails, the cooling function is lost and the device will fail, posing a reliability and/or safety risk.
- Moving parts cannot be allowed in all applications, for instance in applications with moving lamps, such as entertainment lamp/gobo projectors, to prevent gyroscopic effects.
- The phosphor wheel increases the size of the system. A common wheel size has a diameter of 3-4 cm.
- It is difficult to add extraction optics to the phosphor layer, limiting efficiency within a small spot size.
- The phosphor is not restricted along the rotation direction which increases the spot size due to light spreading within the phosphor. This increases the etendue.
- A phosphor wheel is an expensive component to make. A 100$ wheel cost is not uncommon.
- Phosphor wheels are furthermore sensitive in reliability, prone to degradation. This is due to limited heat sinking capability and photo-thermal degradation sensitivity of the phosphor coated. An improvement can be made by using a ceramic phosphor on the phosphor wheel instead of a coating of a powder phosphor in a binder, but this is known to be a quite costly approach.

As an alternative to the rotating phosphor wheel, static solutions have been proposed where laser(s) excite a phosphor layer, typically a ceramic phosphor attached to a heat sink body.

Such a solution is e.g. known from US 2013/0314893 A1 describing an illumination system comprising a laser light source and a wavelength conversion module for generating high brightness illumination by photoluminescence. The wavelength conversion module comprises an optical element comprising a wavelength conversion medium, the wavelength conversion medium being set in a mounting for heat dissipation, and an optical concentrator. The optical element comprises in a specific embodiment a length being equal to its diameter.

Furthermore, and especially in projection the source etendue is very important. The etendue is the product of the source area times the solid angle of the emitted light distribution. The etendue defines the usable light that is produced from the source when matched to the acceptance etendue of the display panel. Hence a too large source etendue may generate a lot of light, but this cannot be harvest by the optical system of the projector. A too small source etendue can put unnecessarily high thermal loads to the source and limit the optical efficiency. An example of a target etendue for a 0.67" DLP display panel is a source etendue of 17 $mm^2$ sr.

Thus, there is still a need for providing a static solution in which overheating of the wavelength conversion module is avoided and with which the reliability and efficiency is improved and the output luminous flux of the light emitting device is increased. Furthermore, there is a need for providing a static solution which is more versatile, simpler in construction, more robust and safe and which is more cost efficient to manufacture. Finally, there is a need for providing a static solution with a light output having a suitable etendue in view of the above considerations.

SUMMARY OF THE INVENTION

It is an object of the present invention to overcome this problem, and to provide a light emitting device comprising a luminescent element in which overheating of the luminescent element is avoided and with which the reliability and efficiency is improved. Furthermore, is an object of the present invention to provide such a light emitting device which is more versatile, simpler in construction, more robust and safe and which is more cost efficient to manufacture. Finally, a further object of the present invention is to provide such a light emitting device with a light output having a suitable etendue in view of the above considerations.

According to a first aspect of the invention, this and other objects are achieved by means of a light emitting device comprising a luminescent element comprising a first face and a second face, the first face comprising a light input surface and one of the first face and the second face comprising a light exit surface, the luminescent element being adapted for receiving first light with a first spectral distribution emitted by at least one laser light source at the light input surface, converting at least a part of the first light with the first spectral distribution to second light with a second spectral distribution, guiding the second light with the second spectral distribution to the light exit surface and coupling at least a part of the second light with the second spectral distribution out of the light exit surface, and a heat sink element arranged to be in thermal contact with at least a part of the luminescent element extending between the first face and the second face, wherein the first face comprises a cross-sectional area A and the luminescent element further comprises a length L being defined as the shortest distance between the first face and the second face and a characteristic length B of the cross sectional area A, the characteristic length B being defined as the square root of the cross sectional area A, and wherein the length L and the characteristic length B of the cross sectional area A are chosen such that they satisfy any one of the relations $L/B \geq 2*E_{Ils}/44(W/mm^2)$ for $\lambda_{THC} < 6$ W/mK, $L/B \geq 1.3*E_{Ils}/44(W/mm^2)$ for 6 W/mK$\leq \lambda_{THC} \leq$8 W/mK, and $L/B \geq 0.85*E_{Ils}/44(W/mm^2)$ for 8 W/mK$< \lambda_{THC}$, where $E_{Ils}$ is the irradiance of the at least one laser light source measured in W/mm$^2$ and $\lambda_{THC}$ is the thermal heat coefficient of the luminescent element at room temperature.

Generally, for light emitting devices according to the invention a too small luminescent element length has been shown to provide insufficient cooling via the applicable surfaces and may consequently suffer unacceptable heat-up. A too large luminescent element length, on the other hand, has been shown to provide an excessive optical loss as the path length for the converted light to escape through the exit window increases.

By providing a light emitting device with a luminescent element having dimensions satisfying the above-defined relations, the luminescent element is made thick with respect to the cross sectional area such as to provide sufficient cooling through the heat sink element, yet still sufficiently optically transparent for the laser light source light to penetrate the majority of the volume of the luminescent element.

Furthermore, the combination of a luminescent element having dimensions satisfying the above-defined relations and the provision of a heat sink provides for a light emitting device in which overheating of the luminescent element is avoided, with which the reliability and efficiency is improved and with which the light output has an increased luminous flux and a suitable etendue in view of the above considerations is obtained.

Also, the light emitting device thus provided is more versatile, very simple in construction, more robust, durable and safe and more cost efficient to manufacture, especially as all moving pats may be avoided and as the number of components is very low and the components are simple in construction and structure. Finally, the low number and simplicity of the components also provide for a very compact light emitting device.

In an embodiment the luminescent element is a scattering luminescent element with a scattering level being such that the transmissivity T of the first light with the first spectral distribution having travelled a path corresponding to the length L of the luminescent element is any one of T<0.3, 0.01<T<0.1 and T≈0.02.

The above defined scattering levels may be obtained with a luminescent element being volume scattering, surface scattering or a combination thereof.

A surface scattering luminescent element may for example be provided in one or more of the following ways:
  A non-polished luminescent element, for instance a luminescent element that is ground to size but not polished, may be provided, thereby reducing processing costs.
  A roughened surface of the heat sink element, such as a ground/flattened heat sink element surface, may be provided. However, care must be taken not to roughen the luminescent element or the heat sink element too strongly as this will increase the thermal resistance significantly. Also a high reflectivity coating on a roughened heat sink element will tend to have a lower reflection coefficient.
  In embodiments where a bonding interface material is used between the luminescent element and the heat sink element, scattering particles may be added to this material.

In an embodiment the luminescent element is a volume scattering luminescent element with a scattering level inside the luminescent element being such with respect to the length L of the luminescent element that the mean free path, MFP, of the first light with the first spectral distribution is any one of between 1 and ⅒ of the length L of the luminescent element, between ½ and ⅕ of the length L of the luminescent element, and about ¼ of the length L for L≤6 mm, and any one of larger than ⅒ of the length L of the luminescent element, larger than ⅕ of the length L of the luminescent element, and larger than ½ of the length L for L>6 mm.

Generally, for light emitting devices according to the invention a sufficiently high scattering value is required to prevent excessive light guiding in the direction of the length L, especially when the luminescent element is very thick/long w.r.t. the lateral dimensions (i.e. a long luminescent element). However, also a too high scattering value is not allowed as this will prevent sufficient laser light source light penetration especially of blue light, limiting the laser light source light conversion or cause a too strong local heat-up of the luminescent element, with insufficient heat spreading over the available luminescent element volume. Also, scattering close to the face functioning as a light exit surface of the luminescent element is preferred to maximize the chance for the light to be backscattered, which increases the optical extraction efficiency. Low scattering increases the penetration depth for the light, giving a more uniform heat-up of the luminescent element, but will result in more losses due to the longer path lengths needed for the light to reflect back towards the light exit surface to escape.

By any of the above-mentioned embodiments relating to scatter levels a light emitting device is provided with which both above requirements for the scattering level is taken into account, thus providing a light emitting device with an optimal trade-off between light guiding in the direction of the length L, sufficient light penetration and sufficient heat spreading is obtained and with which the problems mentioned are reduced considerably or even avoided.

The luminescent element comprises a dopant, and the dopant concentration is chosen taking into account the length L of the luminescent element such that the absorption length of the first light with the first spectral distribution is such that 10% or less of the first light with the first spectral distribution remains after the first light with the first spectral distribution having travelled a path corresponding to the length L of the luminescent element.

In one embodiment the luminescent element is a YAG luminescent element or a LuAG luminescent element and the dopant is Cerium. Other dopants are also feasible.

Generally, for light emitting devices according to the invention, if the dopant concentration is too low compared with the luminescent element length, the conversion efficiency will be limited. If, on the other hand the dopant concentration is too high compared with the luminescent element length, the light is absorbed in a too small sized region of the luminescent element, which gives rise to strong local heat-up and insufficient heat spreading.

By providing the above-mentioned dopant concentration a light emitting device is provided with which both above requirements for the dopant concentration is taken into account, thus providing a light emitting device with an optimal trade-off between high conversion efficiency and sufficiently low local heat-up and sufficient heat spreading is obtained and with which the problems mentioned are reduced considerably or even avoided.

Further points that are also taken into consideration as well as associated problems solved when providing the above-mentioned dopant concentration are:

The level of light conversion desired, that is full conversion vs. partial conversion. Full conversion, e.g. from blue to yellow or blue to green or blue to red requires a higher dopant concentration, such that no or only a small percentage of blue light may exit the system in reflective or transmissive mode. Partial conversion requires a controlled amount of blue light to be extracted from the light exit surface. This is typically used when white light is to be made, such as the combination of blue light+converted yellow light.

The scattering level of the luminescent element as scattering inside the luminescent element will increase the mean free path length for the light further which in turn increases the conversion. Hence for a higher scattering level a smaller dopant concentration is required.

The spectral distribution of the light emitted by the laser light sources. Blue light is required for a proper match to the absorption band of the luminescent element. Thus, if too high wavelengths are used, typically greenish blue, or to low wavelengths, such as deep blue/violet, the absorption coefficient is much reduced. Hence an optimal incident wavelength range much be applied.

The magnitude of the mean free path length desired. Embodiments where the light input surface and the light exit surface of the luminescent element is the same face requires a longer mean free path length and hence lower dopant concentration than embodiments where the light input surface and the light exit surface of the luminescent element is opposite faces.

In an embodiment the light emitting device further comprises an optical element arranged in optical connection with the light input surface of the luminescent element and adapted for coupling the light with the first spectral distribution into the luminescent element and/or for coupling the light with the second spectral distribution out of the luminescent element.

Thereby a light emitting device is provided in which the optical element improves the in- and out-coupling of the light such as to avoid loss of light. The optical element may also provide additional characteristics to the emitted light, e.g. by collimating and/or focusing the light, and/or provide an additional heat spreading effect.

In an embodiment the optical element further is adapted for providing a uniform distribution of the light with the first spectral distribution at the light input surface of the luminescent element.

The incident laser light flux distribution on the luminescent element may strongly impact the local temperature. Ideally the laser light may be fully uniform over the entrance window, but in practice the laser light may be more peaked more strongly in the central region. Providing a high level of uniformity thus minimizes the occurrence of thermal hot spots.

In an embodiment, the optical element comprises a refractive index being within 0.02 or within 0.01 or equal to the refractive index of the luminescent element. When using a bonding material, the bonding material comprises a refractive index being within 0.02 or within 0.01 or equal to both the refractive index of the luminescent element and the refractive index of the optical element. Either of these two embodiments allows an improved light transfer between the luminescent element and the optical element, minimizing reflections and preventing total internal reflection between the luminescent element and the optical element, maximizing the light output. This may result in an extraction gain of as much as about 20%.

In an embodiment the light emitting device further comprises a reflective element arranged on the second face of the luminescent element.

Thereby a light emitting device in which the first face of the luminescent element comprises both the light exit surface and the light input surface is provided. This in turn provides for a simpler and more compact light emitting device. Furthermore, this enables a light emitting device with a luminescent element having a dopant concentration being as low as half the concentration otherwise necessary, which in turn provides a more cost effective light emitting device.

In an embodiment the light emitting device further comprises a dichroic element arranged on the light input surface of the luminescent element.

Thereby a light emitting device is provided in which un-converted light is transmitted by the dichroic element and enters the luminescent element, while converted light may be reflected by the dichroic mirror and emitted from the opposite face of the light emitting device. This in turn provides for a more uniform spectral distribution of the emitted light and a higher degree of conversion within the luminescent element.

In an embodiment an interface layer is provided between the dichroic element and the light input surface of the luminescent element, the interface layer having a refractive index of less than 1.5.

Thereby, the characteristics of the dichroic element may be exploited even for high incident angles of the light, while simultaneously providing a compact and robust light emitting device.

In an alternative embodiment, the characteristics of the dichroic element may also be exploited even for high incident angles of the light by providing an air gap between the dichroic element and the light input surface of the luminescent element.

In an embodiment the first face of the luminescent element comprises both the light exit surface and the light input surface, and wherein the heat sink element furthermore is arranged to be in thermal contact with the second face of the luminescent element.

This provides for a further improved efficiency of the heat spreading provided by the heat sink.

In an embodiment the luminescent element and the heat sink element are connected by clamping in such a way that an air gap of less than 5 μm is present between the luminescent element and the heat sink element.

The advantage of such a connection by clamping is that the light incident angles inside the luminescent element that are exceeding the critical angle are totally internally reflected and hence cannot be lost at the non-ideal reflecting heat sink element. Light incident at angles smaller than the critical angles are extracted from the luminescent element and interact with the heat sink surface to be predominantly reflected.

In an embodiment the luminescent element and the heat sink element are connected by means of a bonding material.

Thereby advantages similar to those obtained by clamping may be obtained, while simultaneously providing a more compact and robust light emitting device as provision of a clamping element may be omitted.

In an embodiment the bonding material comprises scattering particles, whereby advantages as described above in relation to surface scattering may be obtained.

The invention furthermore relates to a lamp, a luminaire, or a lighting system comprising a light emitting device according to any one of the previous claims, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIG. 5 is a plot of the maximum temperature of the luminescent element as a function of the ratio L/B, where L is the length of the luminescent element and B the characteristic length of the cross sectional area A of the luminescent element, for different values of the heat transfer coefficient, THC, in W/mK of the luminescent element.

FIG. 6 is a plot of the average temperature of the luminescent element as a function of the ratio L/B, where L is the length of the luminescent element and B the characteristic length of the cross sectional area A of the luminescent element, for different values of the heat transfer coefficient, THC, in W/mK of the luminescent element.

FIG. 7 is a plot of the average temperature, $T_{av}$, divided by the heat dissipation power, $Q_{heat}$, of the luminescent element as a function of the ratio L/B, where L is the length of the luminescent element and B the characteristic length of the cross sectional area A of the luminescent element, for different values of the heat transfer coefficient, THC, in W/mK of the luminescent element.

FIG. 8 is a plot of the ratio of converted yellow light to un-converted blue light as a function of the mean free path, MFP, for a volume scattering luminescent element for different values of the length L in mm of the luminescent element (values are stated to the right of the plot), the plot illustrating the conversion efficiency for a volume scattering luminescent element. The added circles highlight the optimum scattering MFP as being approximately ¼ of the length L of the luminescent element.

FIG. 9 is a plot of the ratio of converted yellow light to un-converted blue light as a function of length L of the luminescent element, for different values of the mean free path, MFP, in mm (values are stated to the right of the plot) for a volume scattering luminescent element the plot illustrating the conversion efficiency for a volume scattering luminescent element and the effect of adding an optical element in the form of a CPC. The full line illustrates the maximum temperature of the luminescent element when operated at its maximum efficiency.

FIG. 10 is a plot of the mean free path, MFP, or scatter length for a volume scattering luminescent element as a function of the length L of the luminescent element in mm, the coloring illustrating the conversion efficiency with respect to the scale at the right hand side of the plot. The two dashed lines denote minimum and maximum scatter length, such that a line intersecting the values highlighted by the circles in FIG. 9 would be placed between and equidistant from these two dashed lines.

FIG. 11 is a plot of the ratio of converted yellow light to un-converted blue light as a function of the surface scattering Gauss angle in degrees for a surface scattering luminescent element for different values of the length L in mm of the luminescent element (values are stated to the right of the plot), the plot illustrating the conversion efficiency for a surface scattering luminescent element.

FIG. 12 is a plot of the output flux in lumen of the light emitting device, i.e. the flux of the converted emitted light, as a function of the ratio L/B, where L is the length of the luminescent element and B the characteristic length of the cross sectional area A of the luminescent element, for different values of the heat transfer coefficient, THC, in W/mK of the luminescent element, the plot illustrating the maximum flux determined by a maximum temperature of the luminescent element of 220° C., a typical value for Ce doped garnet based luminescent materials. For other types of luminescent materials this maximum temperature will be different and is in most cases lower than 220° C.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
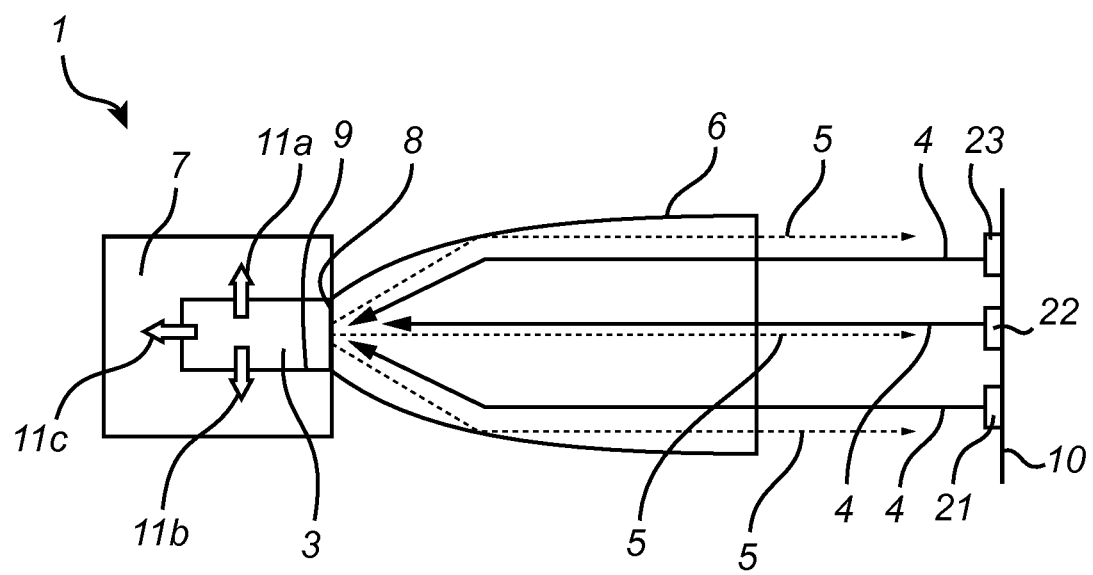
FIG. 1 shows a cross sectional view of a light emitting device according to a first embodiment of the invention.
Figure 2:
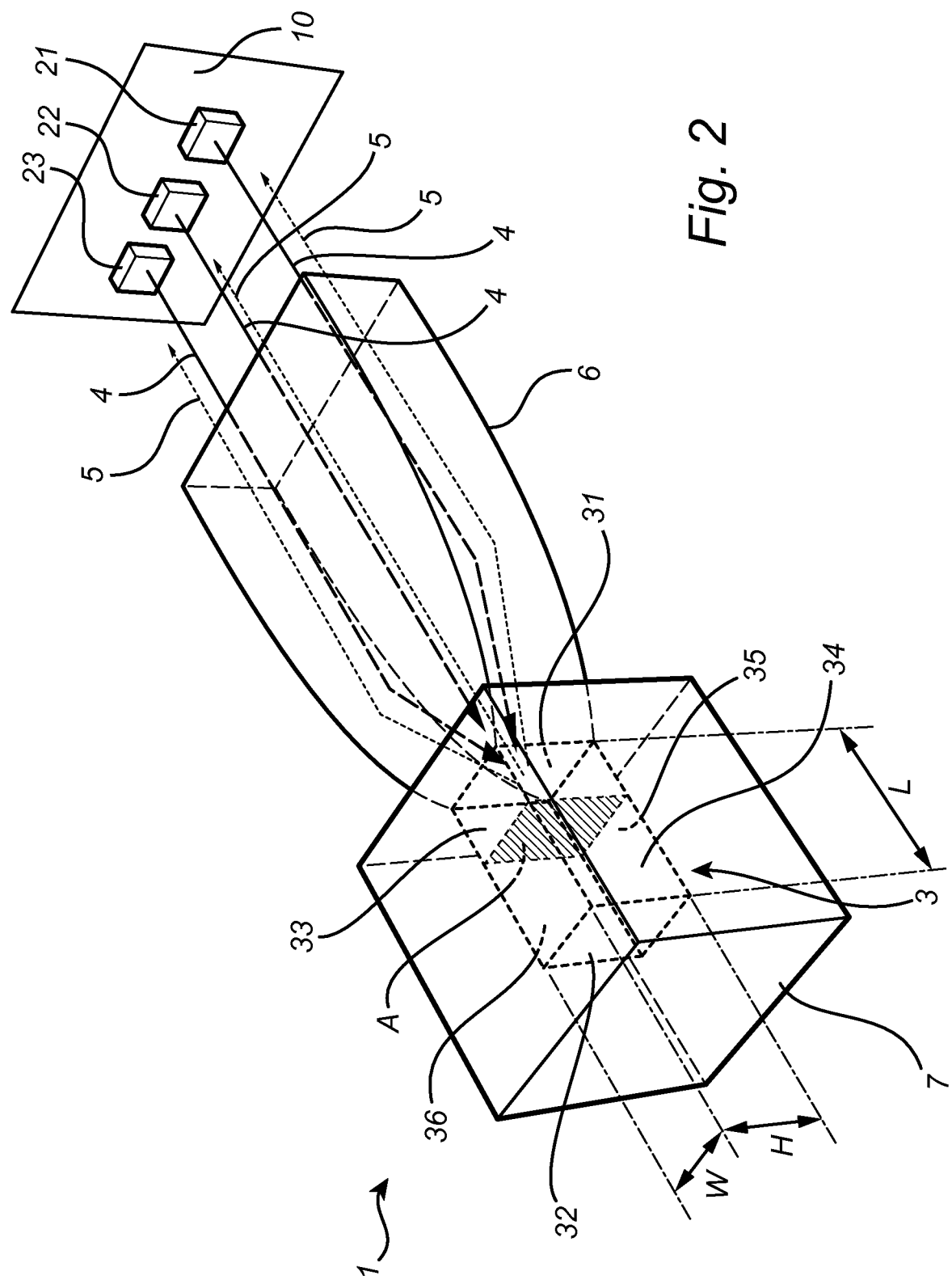
FIG. 2 shows a perspective view of the light emitting device according to FIG. 1.

FIGS. 1 and 2 show a cross sectional and a perspective view, respectively, of a light emitting device 1 according to a first embodiment of the invention.

The light emitting device 1 comprises a luminescent element 3, a heat sink element 7 and a plurality of laser light sources 21, 22, 23.

The luminescent element 3 is generally rod-shaped. The luminescent element 3 generally comprises a first face 31 and a second face 32 as well as a length L being defined as the shortest distance between the first face 31 and the second face 32. The first face 31 of the light emitting device 1 shown in FIGS. 1 and 2 comprises or forms both a light input surface and a light exit surface. Irrespective of the embodiment the first face 31 comprises a cross-sectional area A and a characteristic length B of the cross sectional area A, the characteristic length B being defined as the square root of the cross sectional area A.

Irrespective of the embodiment the luminescent element 3 is adapted for receiving first light 4 with a first spectral distribution emitted by at least one laser light source 21, 22, 23 at the light input surface, converting at least a part of the first light 4 with the first spectral distribution to second light 5 with a second spectral distribution, guiding the second light 5 with the second spectral distribution to the light exit surface and coupling at least a part of the second light 5 with the second spectral distribution out of the first light exit surface.

Generally, and referring to FIG. 2, the luminescent element 3 further comprises a circumferential surface 33, 34, 35, 36 extending between the first face 31 and the second face 32.

In the embodiment illustrated the luminescent element 3 is a rod with a rectangular or quadrilateral cross section and thus comprises four further surfaces 33, 34, 35 and 36. Thus, in the embodiment illustrated the luminescent element 3 further comprises a width W and a height H (cf. FIG. 2), and the cross sectional area A may be defined as A=W*H.

Various materials may be used for the luminescent element 3, and typically the garnet system is very suitable. Non-limiting examples are:

Yellow: YAG:Ce where higher % Ce will cause a slight red shift.
Red shifted yellow/orange: YGdAG:Ce where higher amounts of Gadolinium Gd will cause a red shift.
Green: LuAG:Ce or LuYAG:Ce (green-yellowish); or YGaAG (Gallium Ga causes blue shift).
Red: YGdAG:Ce (emission is orange, for uses a red source the red emission needs to be filtered using a dichroic filter).

It is also possible to consider combinations of materials, such as various garnet colors that are co-sintered into the same luminescent element. This may allow tuning of the spectral output. Also, the luminescent element may in principle be combined with a thin Lumiramic phosphor tile, for instance on the front side or back side of the luminescent element. This may allow a further control over the color point, for instance, by adding a red emitting nitride Lumiramic (ECAS:Eu or BSSNE:Eu) to make a warm white in combination with a YAG luminescent element.

Generally, suitable materials for luminescent elements 3 as used in the invention is sapphire, polycrystalline alumina and/or un-doped transparent garnets such as YAG, LuAG having a refractive index of n=1.7. An additional advantage of this material (above e.g. glass) is that it has a good thermal conductivity, thus diminishing local heating. Other suitable materials include, but are not limited to, glass, quartz and transparent polymers. In another embodiment the luminescent element material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The luminescent element 3 or waveguide comprises a luminescent material for converting the light to another spectral distribution. Suitable luminescent materials as used in the invention include inorganic phosphors, such as doped YAG, LuAG, organic phosphors, organic fluorescent dyes and quantum dots which are highly suitable for the purpose of the present invention.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS2) and/or silver indium sulfide (AgInS2) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having very low cadmium content.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Obviously, the luminescent material may also be an inorganic phosphor. Examples of inorganic phosphor materials include, but are not limited to, cerium (Ce) doped YAG (Y3Al5O12) or LuAG (Lu3Al5O12). Ce doped YAG emits yellowish light, whereas Ce doped LuAG emits yellow-greenish light. Examples of other inorganic phosphors materials which emit red light may include, but are not limited to ECAS and BSSN; ECAS being Ca1-xAlSiN3:Eux wherein $0<x\leq 1$, preferably $0<x\leq 0.2$; and BSSN being Ba2-x-zMxSi5-yAlyN8-yOy:Euz wherein M represents Sr or Ca, $0\leq x\leq 1$, $0\leq y\leq 4$, and $0.0005\leq z\leq 0.05$, and preferably $0\leq x\leq 0.2$.

According to a preferred embodiment of the present invention, the luminescent material is essentially made of material selected from the group comprising (M<I>1-x-yM<II>xM<III>y)3(M<IV>1-zM<V>z)5O12- where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu or mixtures thereof, M<IV> is Al, M<V> is selected from the group comprising Ga, Sc or mixtures thereof, and $0\leq x\leq 1$, $0\leq y\leq 0.1$, $0\leq z\leq 1$, (M<I>1-x-y-M<II>x,M<III>y)2O3- where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu, Bi, Sb or mixtures thereof, and $0\leq x\leq 1$, $0\leq y\leq 0.1$, (M<I>1-x-yM<II>xM<III>y)S1-zSez- where M<I> is selected from the group comprising Ca, Sr, Mg, Ba or mixtures thereof, M<II> is selected from the group comprising Ce, Eu, Mn, Tb, Sm, Pr, Sb, Sn or mixtures thereof, M<III> is selected from the group comprising K, Na, Li, Rb, Zn or mixtures thereof, and $0\leq x\leq 0.01$, $0\leq y\leq 0.05$, $0\leq z\leq 1$, (M<I>1-x-yM<II>xM<III>y)O— where M<I> is selected from the group comprising Ca, Sr, Mg, Ba or mixtures thereof, M<II> is selected from the group comprising Ce, Eu, Mn, Tb, Sm, Pr or mixtures thereof, M<III> is selected from the group comprising K, Na, Li, Rb, Zn or mixtures thereof, and $0\leq x\leq 0.1$, $0\leq y\leq 0.1$, (M<I>2-xM<II>xM<III>2)O7- where M<I> is selected from the group comprising La, Y, Gd, Lu, Ba, Sr or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and $0<=x<=1$, (M<I>1-xM<II>xM<III>1-yM<IV>y)O3- where M<I> is selected from the group comprising Ba, Sr, Ca, La, Y, Gd, Lu or mixtures thereof, M<II> is selected from the group comprising Eu, Tb, Pr, Ce, Nd, Sm, Tm or mixtures thereof, M<III> is selected from the group comprising Hf; Zr, Ti, Ta, Nb or mixtures thereof, and M<IV> is selected from the group comprising Al, Ga, Sc, Si or mixtures thereof, and $0\leq x\leq 0.1$ $0\leq y\leq 0.1$, or mixtures thereof.

Particularly suitable luminescent materials, however, are Ce doped Yttrium aluminum garnet (YAG, $Y_3Al_5O_{12}$) and Lutetium-Aluminum-Garnet (LuAG).

The light emitting device 1 further comprises a heat sink element 7. Arrows 11a, 11b and 11c illustrate the conduction of heat away from the luminescent element 3. The heat sink element 7 is arranged to be in thermal contact with the circumferential surface, in FIGS. 1 and 2 the four further surfaces 33, 34, 35, 36, of the luminescent element extending between the first face 31 and the second face 32 as well as with the second face 32. The second face 32 may optionally contain a reflective layer or foil, such as an Alanod reflector, that may provide superior reflectance (e.g. 98%) over the reflector coating on the heat sink element.

The heat sink element 7 typically consists of a high thermal conductivity material, such as copper and has a high surface reflectivity. The heat sink element 7 may be coated with aluminum or protected silver.

The luminescent element 3 may be bonded to the heat sink element 7 with a thin layer of bonding material 9, such as a silicone. This can reduce the thermal resistance compared to an air gap of the same thickness, but reduced the angular range that is internally reflected inside the luminescent element. Preferably such a bonding material 9 has a low optical absorption, low index of refraction and a high thermal conductivity. The bonding material 9 may be filled with scattering particles to increase the reflectivity and provide diffusivity/angular spread to the reflectance to facilitate angular light recycling. Also such scattering particles can help to increase the thermal conductivity.

The luminescent element 3 is typically clamped between two parts of the heat sink element 7. For optimal cooling the flatness of the luminescent element 3 as well as the flatness of the heat sink element 7 should be well controlled in order to clamp very tightly and minimize the air gap 91 (cf. FIG. 3) present between the heat sink element 7 and the luminescent element 3. The average size of the air gap 91 may be, for instance, 5 μm or as low as 1 μm.

The light emitting device 1 further comprises a plurality of laser light sources 21, 22, 23 emitting, when in operation, first light 4 with a first spectral distribution. In other embodiments only one laser light source emitting, when in operation, first light 4 with a first spectral distribution. The first light 4 typically comprises a first spectral distribution being in the blue wavelength region but is not limited thereto. The plurality of laser light sources 21, 22, 23 may be arranged on a substrate 10 such as a PCB. The converted light or the second light 5 with the second spectral distribution is typically, but not limited to, yellow, red or green.

The light emitting device 1 further comprises an optional optical element 6 adapted for coupling light 4 into the luminescent element 3 and/or light 5 out of the luminescent element 3. The optical element 6 may be connected directly to the luminescent element 3 or a bonding material 8 may be provided between the optical element 6 and the luminescent element 3. An example of such an optical element 6 is an extraction dome. In a particular embodiment, such as those shown in the Figures, the optical element 6 has the shape of a Compound Parabolic Concentrator (CPC) that extracts and collimates the converted light 5, but can also help to focus incident light 4 onto the luminescent element 3.

This optical element 6 may further act as a heat spreader and hence the optical element 6 may be made of a transparent high thermal conductivity material. This allows thermal transport over a wider area for cooling to the ambient (air). Furthermore, such a heat conducting optical element 6 may be attached to a separate heat sink to allow additional cooling via conduction.

Figure 3:
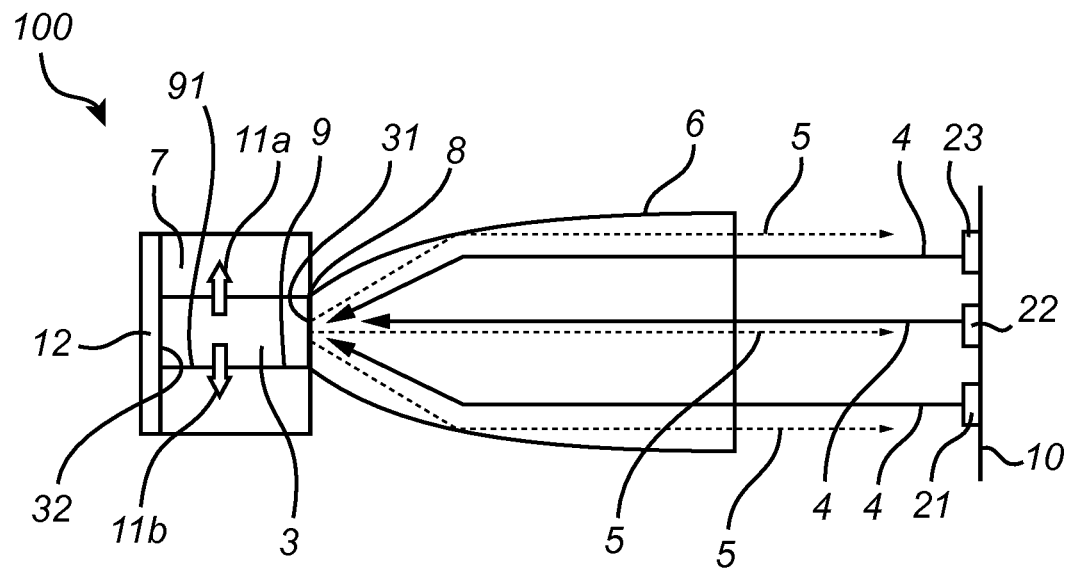
FIG. 3 shows a cross sectional view of a light emitting device according to a second embodiment of the invention.

Turning now to FIG. 3, a cross sectional side view of a second embodiment of a light emitting device 100 according to the invention is shown. The light emitting device 100 differs from that shown in FIGS. 1 and 2 and described above in that it further comprises a reflective element 12 arranged at or on the second face 32. Furthermore the heat sink element 7 is arranged to be in thermal contact with the circumferential surface, in FIG. 3 the four further surfaces 33, 34, 35, 36, of the luminescent element extending between the first face 31 and the second face 32 but not with the second face 32. Depending on the size of the reflective element 12, the heat sink element 7 may or may not be connected to the reflective element 12. Also, an air gap 91 is provided between the luminescent element 3 and the heat sink element 7.

Thus, in FIGS. 1 to 3 light emitting devices 1 and 100 with a light input surface and a light exit surface being provided on or formed by the same face 31, and thus having reflective operation is illustrated.

Figure 4:
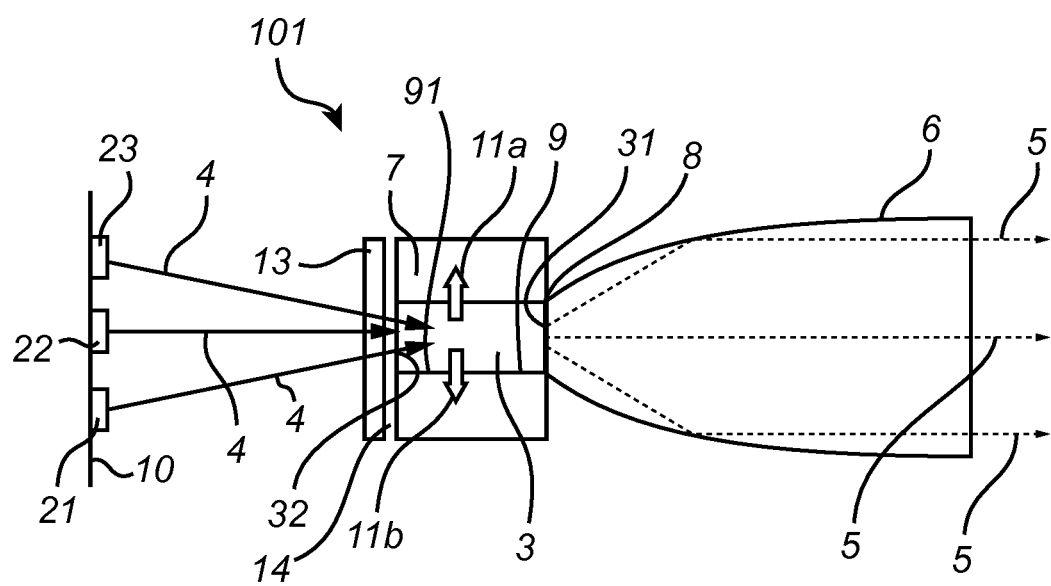
FIG. 4 shows a cross sectional view of a light emitting device according to a third embodiment of the invention.

Turning now to FIG. 4, a cross sectional side view of a third embodiment of a light emitting device 101 according to the invention is shown. The light emitting device 101 differs from those shown in FIGS. 1 to 3 and described above in that it further comprises a dichroic element 13 arranged at the second face 32. An air gap 14 is provided between the dichroic element 13 and the second face 32 of the luminescent element 3. The air gap 14 may also optionally extend between the dichroic element 13 and the heat sink element 7 in case the area of the dichroic element 13 is larger than that of the second face 32. The dichroic element 13 may by way of examples be a dichroic coating on a glass or sapphire substrate, or be a dichroic layer or coating applied directly to the second face 32. In an alternative to the air gap 14, the dichroic element 13 may be attached to the luminescent element 3, for example by means of a low index material, e.g. a methylsilicone (refractive index n=1.41).

Furthermore the heat sink element 7 is arranged to be in thermal contact with the circumferential surface, in FIG. 4 the four further surfaces 33, 34, 35, 36, of the luminescent element extending between the first face 31 and the second face 32 but not with the second face 32 or for that matter the reflective element 12. Also, an air gap 91 is provided between the luminescent element 3 and the heat sink element 7.

Also, the laser light sources 21, 22, 23 are arranged on an opposite side of the luminescent element 3 with respect to the optical element 6, such that the light input surface is provided or formed by the second face 32, while the light exit surface is provided or formed by the first face 31. In this embodiment the optical element 6 need consequently only be adapted for coupling light 5 out of the luminescent element 3.

Thus, in FIG. 4 a light emitting device 101 with a light input surface and a light exit surface being provided on or formed by opposite faces 31 and 32, and thus having transmissive operation, is illustrated. For instance the dichroic element 13 is transparent for blue light, yet on the other hand, has a high reflection for the converted light inside the luminescent element, such as yellow, red and/or green. These dichroic characteristics can be realized up to high incident angles in the best way when there is a lower index interface between the dichroic substrate and the luminescent element, typically an air gap 14. The dichroic may then be attached to the heat sink element outside the optical window area.

In yet another alternative a light emitting device with a combination of transmissive and reflective operation, and in which the incident laser light source light 4 comes from 2 or more multiple sides of the luminescent element 3 may be provided as well. In principle the laser light source light 4 may also be entering the luminescent element 3 via one or more holes in the heat sink element 7.

Example—Measurements

FIGS. 5 to 13 illustrate optical simulations made on an exemplary light emitting device according to the invention. The optical ray-trace simulations were made on a light emitting device 1 of the type shown in FIGS. 1 and 2 and comprising a rectangular rod-shaped luminescent element 3 with a heat sink element 7 on five faces 32, 33, 34, 35, 36 and, as a focusing optical element 6, a glass compound parabolic concentrator (CPC) attached to the first face 31. The configuration was modeled in reflective mode, that is, the CPC is used both for injecting the laser light 4 and for extracting the converted light 5 from the luminescent element. The luminescent element 3 used was a YAG ceramic luminescent element. The laser light 4 injected into the luminescent element 3 was blue and the converted light 5 green or yellow.

First, the heat load in the YAG ceramic luminescent element was determined by the conversion, i.e. absorption of blue light. The blue light absorption along the length L of the luminescent element is determined by the phosphor concentration and scattering properties of the YAG ceramic luminescent element. In the thermal simulations the absorption is described with a so-called Lambert-Beer relation (with absorption parameter k) for the thermal load along the ceramic luminescent element. The results of the thermal simulations are shown in FIGS. 5-7 and illustrate the 2 regimes in which the luminescent element can operate properly.

Figure 6:
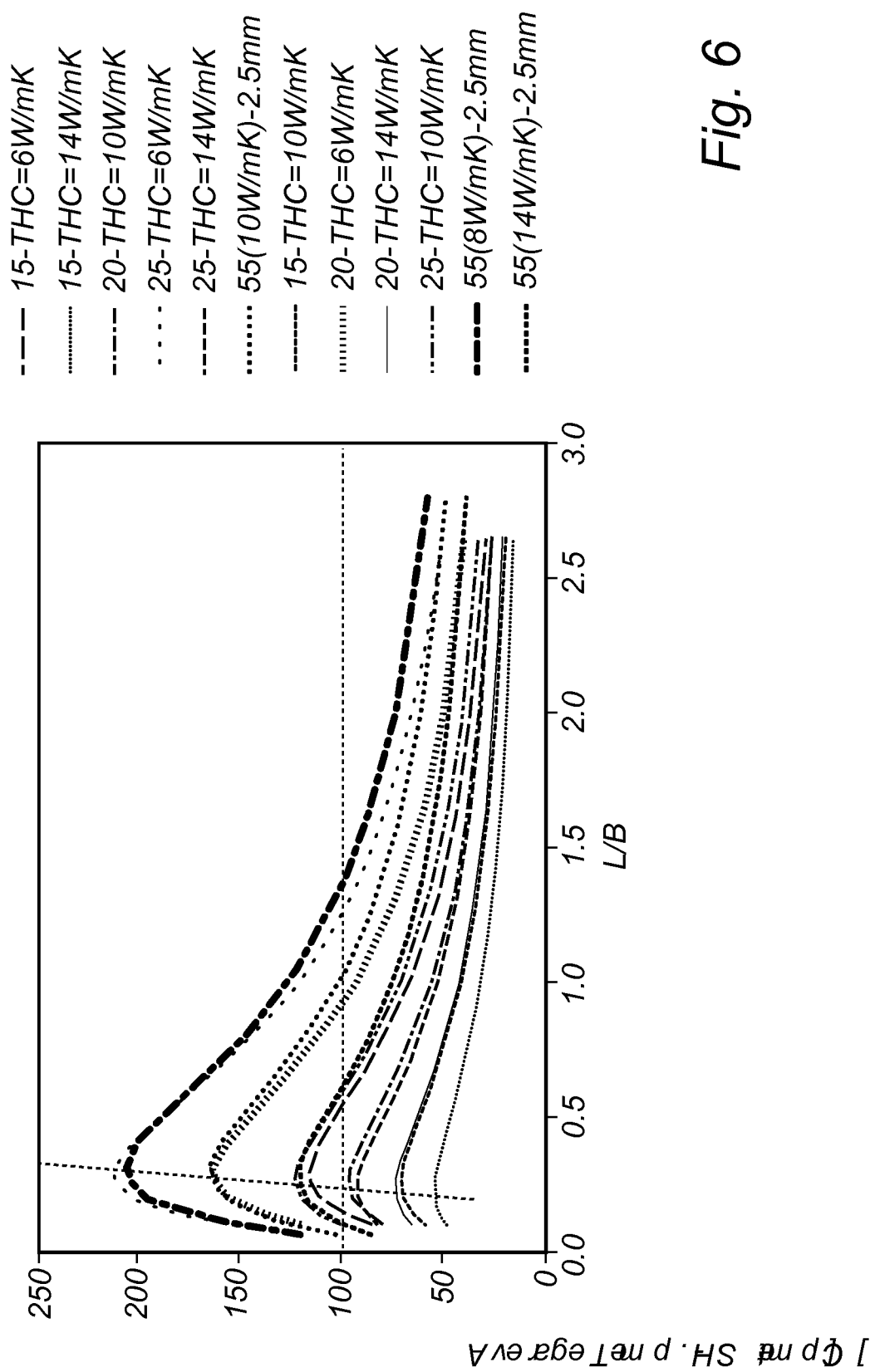
Figure 7:
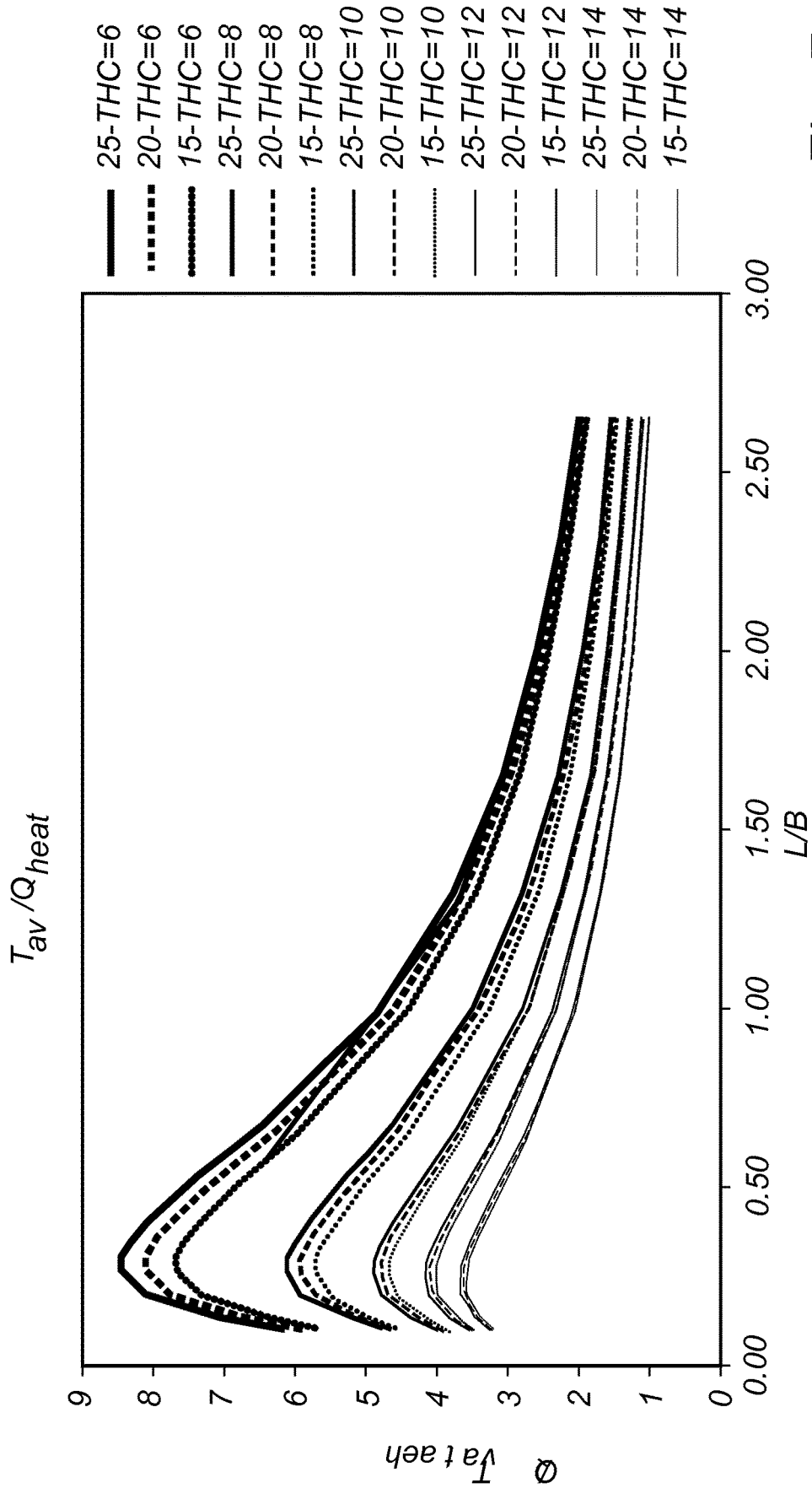

The graphs show the temperature difference between the heat sink and the maximum temperature in the YAG ceramic luminescent element (FIG. 5), the average temperature in the YAG ceramic luminescent element (FIG. 6) and the ratio of the average temperature to the heat dissipation power (FIG. 7). In FIG. 5 the full black line illustrates the absorption coefficient of the YAG ceramic luminescent element. The horizontal dashed line in FIGS. 5 and 6, respectively, illustrate the maximum allowed temperature in the YAG ceramic luminescent element. In the right hand legend on FIGS. 5-7, the first number, i.e. 15, 20, 25, 55, refers to the heat dissipation power of the luminescent element. The second number having the unit W/mK is the heat transfer coefficient, THC, of the luminescent element at room temperature. The simulations were conducted on a luminescent element with a diameter of 2 mm, except for where a third number, namely 2.5 mm, indicating a different diameter is stated in the right hand legend on FIGS. 5-7.

Figure 5:
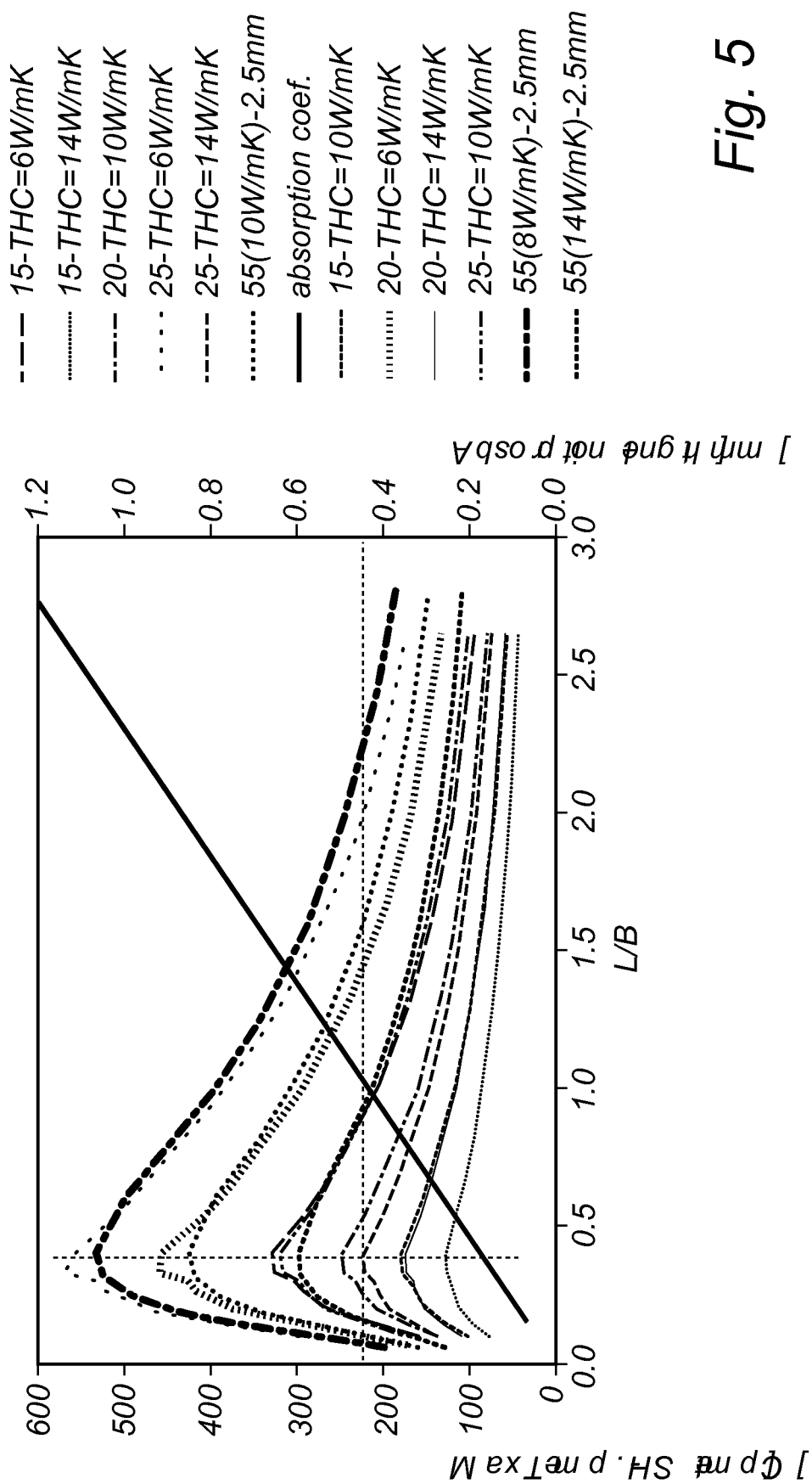
FIGS. 5-12 show plots illustrating various simulations made on an exemplary light emitting device generally according to the first embodiment of the invention and comprising a luminescent element, but with variation of relevant parameters. Further details regarding the light emitting device is given further below. More particularly.

Based on the results shown in FIGS. 5, 6 and 7 the relations that the dimensions of the luminescent element must fulfill according to the invention can readily be derived.

Figure 8:
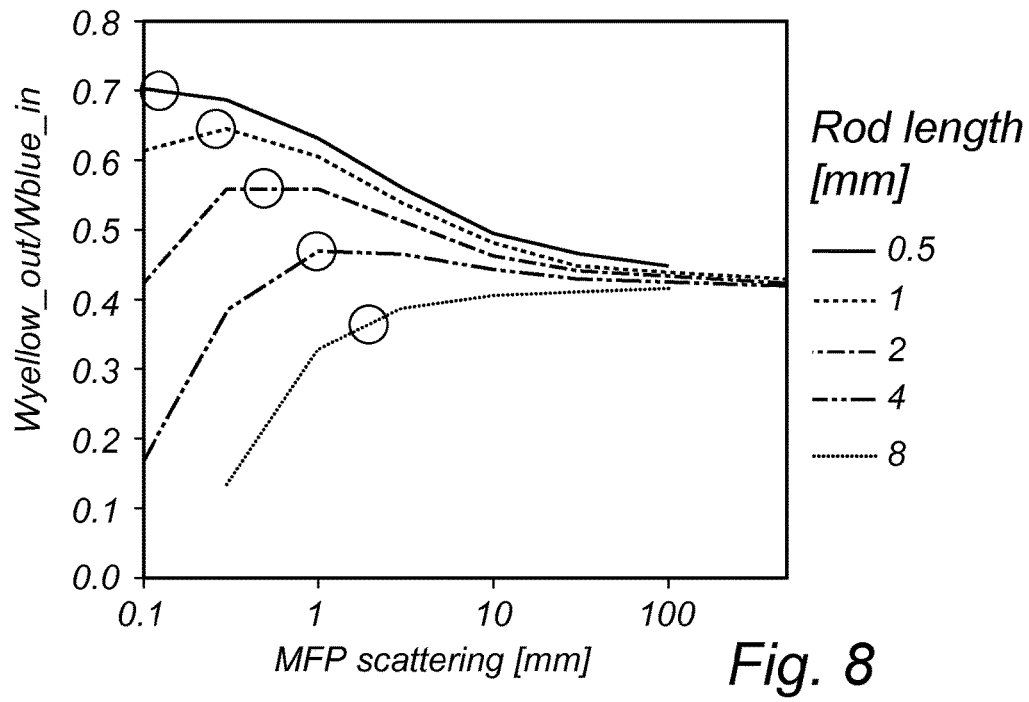
Figure 9:
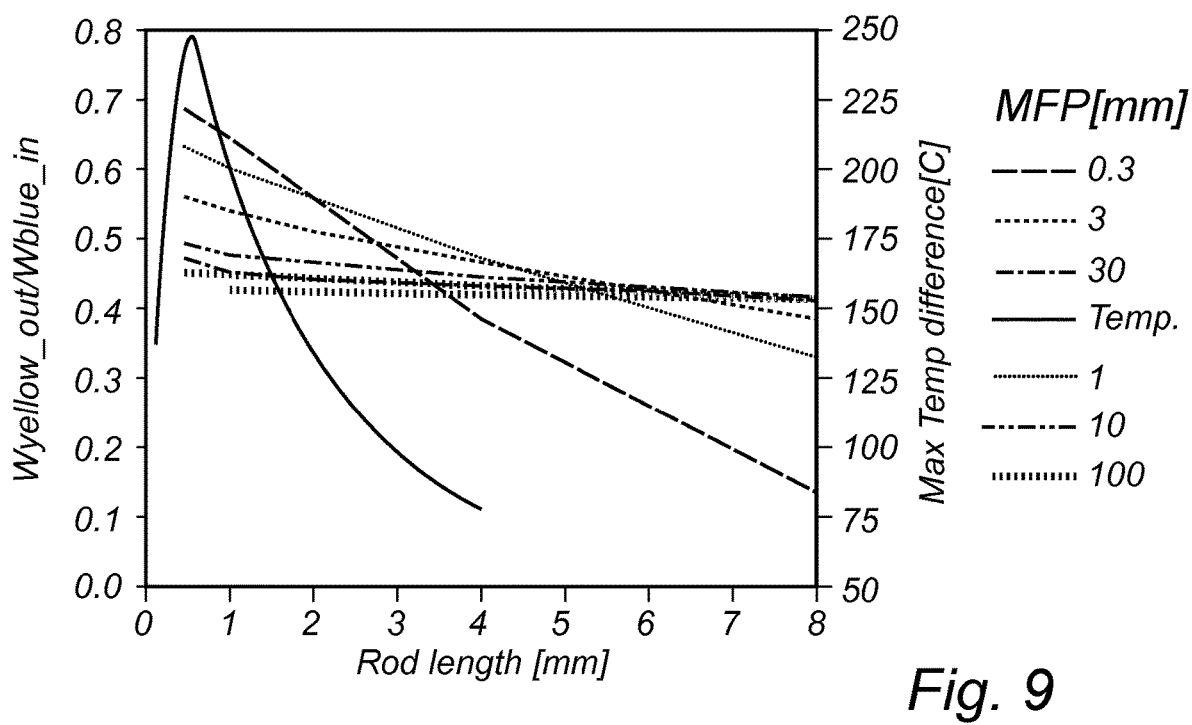
Figure 10:
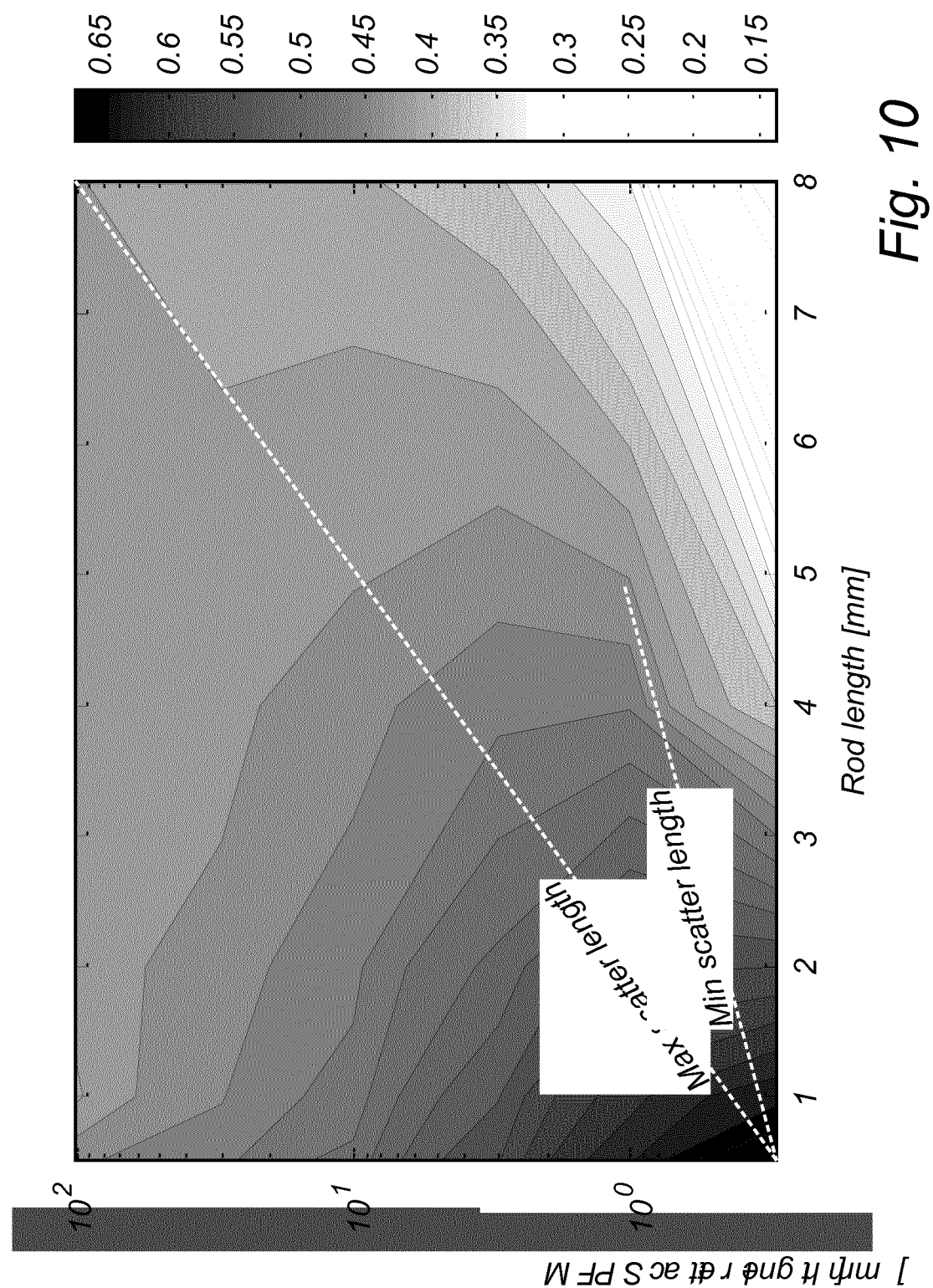

FIGS. 8, 9 and 10 illustrate the use of a volume scattering luminescent element in terms of the conversion efficiency. FIG. 8 shows the calculated conversion efficiency of the light emitting device illustrated in FIG. 1 as a function of the volume scattering strength indicated as the Mean Free Path (MFP) of scattering. A short MFP indicates strong volume scattering, a long MFP weak volume scattering. The various curves represent various lengths L of the luminescent element. For each luminescent element length L and scattering strength MFP the dopant concentration is set to a value such that an identical degree of blue conversion is achieved, i.e. 99%. It is seen that for each length L there is an MFP where the conversion efficiency has an optimum. The circles indicate the points where the MFP is ¼ of the length L, which is where approximately the optimum efficiency is reached. In FIG. 9 the same calculated conversion efficiency is plotted but now as a function of the luminescent element length L. The various curves now indicate various degree of volume scattering. It is seen that for each luminescent element length the maximum efficiency is reached at a specific MFP. Also plotted in FIG. 9 is the maximum temperature in the luminescent element as a function of the luminescent element length under the conditions that the luminescent element is operated at its maximum efficiency. It is seen that the most unfavorable (highest) maximum temperature is reached with a luminescent element length of about 1 mm.

Based on the results shown in FIGS. 8 and 9 the relations between scattering level and mean free path, MFP, according to the invention can readily be derived. FIG. 10 in particular illustrates the window of the scatter length or MFP, inside of which it is desired to keep the MFP. Based on the results shown in FIGS. 8, 9 and 10 the relation between the MFP and the length of the luminescent element according to the invention may also readily be derived.

Figure 11:
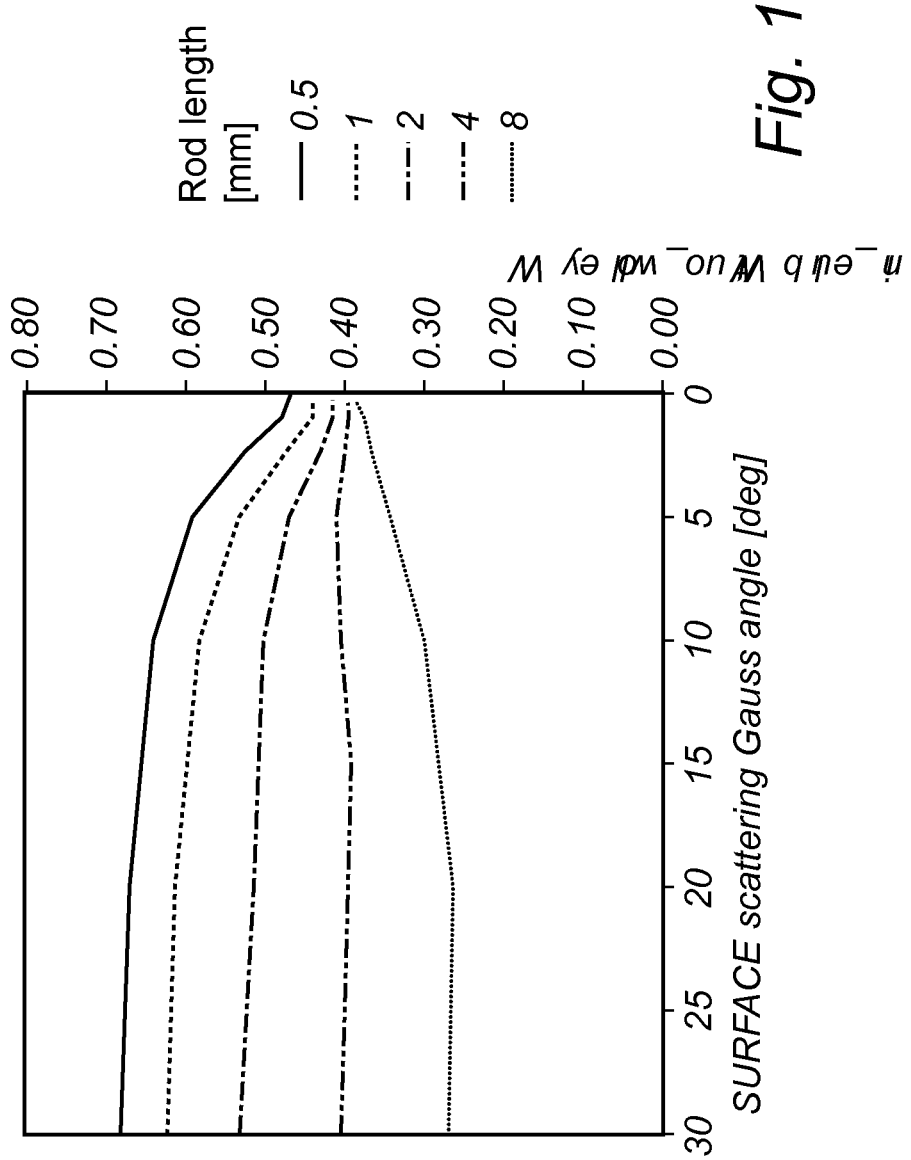

FIG. 11 illustrates the use of a surface scattering luminescent element in terms of the conversion efficiency. Based on the results shown in FIG. 11 the relations between scattering level and transmissivity T according to the invention can readily be derived. The surface scattering is described by means of the scattering angle distribution, which here is Gaussian. FIG. 11 illustrates that for short luminescent elements (L<3 mm) surface scattering improves the efficiency. For long luminescent elements (L>5 mm) surface scattering decreases the efficiency. For intermediate lengths (L=3-5 mm) surface scattering has little effect.

Figure 12:
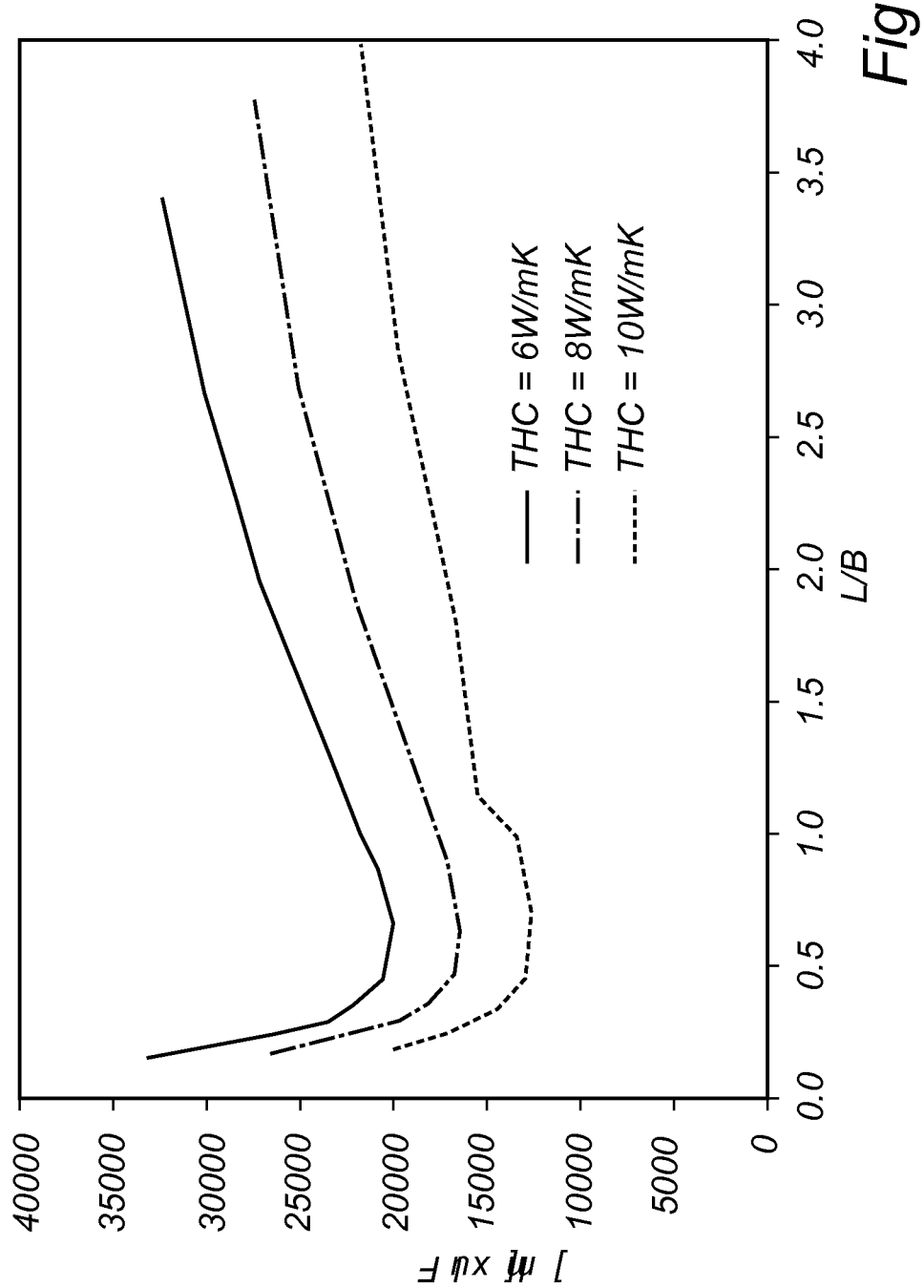

Finally, FIG. 12 illustrates the maximum flux in lumen of the light emitting device, i.e. the maximum flux of the converted emitted light, determined by a maximum temperature of the luminescent element of 220° C. as a function of the ratio L/B, where L is the length of the luminescent element and B the characteristic length of the cross sectional area A of the luminescent element, for different values of the heat transfer coefficient, THC, in W/mK of the luminescent element. FIG. 12 thus illustrates the increased efficiency of a light emitting device according to the invention.

Example—Manufacture of Luminescent Element and Control of Scatter Level

There are two main technology routes to make the luminescent element: either via single crystal technology (grown from the melt) or via poly crystal technology (sintered from pressed powders, typically via reactive sintering). When the luminescent element is a single crystal the material is by definition quite transparent. Hence, to control and optimize volume scatter in the luminescent element only poly crystal fabrication technology is suitable.

There are various ways to control the scatter level inside the luminescent element:

Scatter at pores. The porosity can be tuned by the sintering process. The sintering atmosphere that is used to sinter the material influences the amount of residual pores. Listed from provision of more scattering to less scattering the following sintering atmospheres may be used: air/$N_2$; dry/wet FG; vacuum. When the material is hot isostatically pressed (HIP) after sintering even higher transparencies can be realized.

Scatter at second phase. Depending on the compositional details (stoichiometry) a second phase may be formed at the grain boundaries, which gives rise to scatter. This may result in the sintering process or be induced in a subsequent anneal procedure and depends on the sinter/anneal temperature used. However, the exact scatter level is hard to control via this method and is relatively difficult to reproduce. Hence this route is less preferred.

Adding a certain concentration of templates to the precursor powders. These can be polymeric particles, e.g. of 5 micron size, that are burned out in the subsequent processing, but allow the formation of voids, e.g. of 4 micron, that result in scatter.

Example—Controlling Incident Light Uniformity

Depending on the optical focusing system or optical element 6 used to direct a high level of incident light 4 to the light input surface of the luminescent element, the light may be collimated too strongly on the surface of the luminescent element. This has a profound influence on the local temperature rise of the luminescent element. Measures can be taken to correct the uniformity, such as using a less strong collimating lens, applying the luminescent element out of focus or adding a diffuser/smoothing optic in the optical focusing system.

Example—Clamping the Luminescent Element

Clamping of the luminescent element 3 may be provided using 'luminescent element holders', typically a metal block, such as copper blocks that are spring loaded to press on the luminescent element side faces. A particular useful way of clamping from all sides is a configuration where the luminescent element is clamped in an angle of 45 degrees between two luminescent element holders. To prevent risk of stress localization at the corners of the luminescent element, the clamp may have slightly rounded corners. The luminescent element holders are pressed on top the luminescent element by screws that are spring loaded. Care must be taken to have the cavity angles in the luminescent element holder as well as the cross-section angle of the luminescent element closely matching 90 degrees.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a luminescent element comprising a first face and a second face, the first face comprising a light input surface and one of the first face and the second face comprising a light exit surface, the luminescent element being adapted for receiving first light with a first spectral distribution emitted by at least one laser light source at the light input surface, converting at least a part of the first light with the first spectral distribution to second light with a second spectral distribution, guiding the second light with the second spectral distribution to the light exit surface and coupling at least a part of the second light with the second spectral distribution out of the light exit surface, and
a heat sink element arranged to be in thermal contact with at least a part of the luminescent element extending between the first face and the second face, wherein
the first face comprises a cross-sectional area A and the luminescent element further comprises a length L being defined as the shortest distance between the first face and the second face and a characteristic length B of the cross sectional area A, the characteristic length B being defined as the square root of the cross sectional area A, and wherein
the length L and the characteristic length B of the cross sectional area A are chosen such that they satisfy any one of the relations $L/B \geq 2*E_{lls}/44(W/mm^2)$ for $\lambda_{THC}<6$ W/mK, $L/B \geq 1.3*E_{lls}/44(W/mm^2)$ for 6 W/mK$\leq \lambda_{THC} \leq 8$ W/mK, and $L/B \geq 0.85*E_{lls}/44(W/mm^2)$ for 8 W/mK$<\lambda_{THC}$, where $E_{lls}$ is the irradiance of the at least one laser light sources measured in W/mm$^2$ and $\lambda_{THC}$ is the thermal heat coefficient of the luminescent element at room temperature, wherein the luminescent element comprises a dopant, and wherein the dopant concentration is chosen taking into account the length L of the luminescent element such that the absorption length of the first light with the first spectral distribution is such that 10% or less of the first light with the first spectral distribution remains after the first light with the first spectral distribution having travelled a path corresponding to the length L of the luminescent element, and wherein the bonding material comprises scattering particles.

2. A light emitting device according to claim 1, wherein the luminescent element is a scattering luminescent element with a scattering level being such that the transmissivity T of the first light with the first spectral distribution having travelled a path corresponding to the length L of the luminescent element is any one of T<0.3, 0.01<T<0.1 and T≈0.02.

3. A light emitting device according to claim 1, wherein the luminescent element is a volume scattering luminescent element with a scattering level inside the luminescent element being such with respect to the length L of the luminescent element that the mean free path, MFP, of the first light with the first spectral distribution is any one of between 1 and 1/10 of the length L of the luminescent element, between 1/2 and 1/5 of the length L of the luminescent element, and about 1/4 of the length L for L≤6 mm, and any one of larger than 1/10 of the length L of the luminescent element, larger than 1/5 of the length L of the luminescent element, and larger than 1/2 of the length L for L>6 mm.

4. A light emitting device according to claim 1, and further comprising an optical element arranged in optical connection with the light input surface of the luminescent element and adapted for coupling the light with the first spectral distribution into the luminescent element and/or for coupling the light with the second spectral distribution out of the luminescent element.

5. A light emitting device according to claim 4, wherein the optical element further is adapted for providing a uniform distribution of the light with the first spectral distribution at the light input surface of the luminescent element.

6. A light emitting device according to claim 1, and further comprising a reflective element arranged on the second face of the luminescent element.

7. A light emitting device according to claim 1, and further comprising a dichroic element arranged on the light input surface of the luminescent element.

8. A light emitting device according to claim 7, wherein an interface layer is provided between the dichroic element and the light input surface of the luminescent element, the interface layer having a refractive index of less than 1.5.

9. A light emitting device according to claim 1, wherein the first face of the luminescent element comprises both the light exit surface and the light input surface, and wherein the heat sink element furthermore is arranged to be in thermal contact with the second face of the luminescent element.

10. A light emitting device according to claim 1, wherein the luminescent element and the heat sink element are connected by clamping in such a way that an air gap of less than 5 μm is present between the luminescent element and the heat sink element.

11. A light emitting device according to claim 1, wherein the luminescent element and the heat sink element are connected by means of a bonding material.

12. A light emitting device according to claim 4, wherein the optical element comprises a refractive index being within 0.02 or within 0.01 or equal to the refractive index of the luminescent element, and/or wherein, when using a bonding material, the bonding material comprises a refractive index being within 0.02 or within 0.01 or equal to both the refractive index of the luminescent element and the refractive index of the optical element.

13. A lamp, a luminaire, or a lighting system comprising a light emitting device according to claim 1, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

14. A light emitting device according to claim 1, wherein the heat sink element has a roughened surface.

* * * * *